United States Patent

Suzuki et al.

[11] Patent Number: 5,731,388
[45] Date of Patent: *Mar. 24, 1998

[54] PHOTOCURABLE RESINS FOR STEREOLITHOGRAPHY AND COMPOSITIONS CONTAINING SAME

[75] Inventors: Toshiharu Suzuki; Tatsuhiko Ozaki; Hirokazu Matsueda, all of Aichi, Japan

[73] Assignee: Takemoto Yushi Kabushiki Kaisha, Aichi, Japan

[*] Notice: The term of this patent shall not extend beyond the expiration date of Pat. No. 5,591,388.

[21] Appl. No.: 554,732

[22] Filed: Nov. 7, 1995

[30] Foreign Application Priority Data

Dec. 28, 1994 [JP] Japan .................................. 6-340047

[51] Int. Cl.$^6$ ...................................................... C08F 26/06
[52] U.S. Cl. ........................ 525/404; 430/284.1; 522/96; 525/404; 525/450; 528/44; 528/75; 528/80; 528/84; 528/85
[58] Field of Search .......................... 430/284.1; 522/96; 525/404, 450; 528/44, 75, 80, 84, 85

[56] References Cited

U.S. PATENT DOCUMENTS

| | | | |
|---|---|---|---|
| 4,347,174 | 8/1982 | Nagase et al. | 526/320 |
| 4,868,325 | 9/1989 | Reiners et al. | 560/26 |
| 4,879,402 | 11/1989 | Reiners et al. | 560/26 |
| 4,902,440 | 2/1990 | Takeyama et al. | 522/96 |
| 5,302,669 | 4/1994 | Fusukawa et al. | 525/440 |
| 5,459,205 | 10/1995 | Fusukawa et al. | 525/846 |
| 5,591,563 | 1/1997 | Suzuki et al. | 522/96 |

*Primary Examiner*—John M. Cooney, Jr.
*Attorney, Agent, or Firm*—Keiichi Nishimura

[57] ABSTRACT

Photocurable resins containing unsaturated urethane of a specified form and vinyl monomer which is N-(meth)acryloylmorpholine or its mixture with di-ol di(meth)acrylate at a rate within a specified range and compositions containing such a resin and a filler such as solid particles and/or inorganic whiskers of specified kinds at a specified rate are capable of yielding stereo lithographed objects with improved mechanical and thermal properties and form precision.

12 Claims, No Drawings

PHOTOCURABLE RESINS FOR STEREOLITHOGRAPHY AND COMPOSITIONS CONTAINING SAME

BACKGROUND OF THE INVENTION

This invention relates to photocurable resins for stereolithography and compositions containing such resins.

Numerically controlled cutting process methods are used for the production of various kinds of models such as mold production models, profiling process models and die-sinking electric discharge process models as well as regular shape products. More recently, attention is being paid to the optical stereolithography whereby a photo-curable resin or its composition is exposed to a radiation for hardening to form a desired stereolithographed object. This invention relates to photocurable resins suitably adapted to such processes in stereolithography, and more particularly to photocurable resins for stereolithography containing unsaturated urethane and compositions containing such resins.

Examples of known photocurable resins for stereolithography containing unsaturated urethane include (1) those containing unsaturated urethane obtained from polyurethane diisocyanate and hydroxy alkylacrylate (such as disclosed in Japanese Patent Publication Tokkai 2-145616), (2) those containing unsaturated urethane obtained from polyurethane diisocyanate and triol di(meth)acrylate (such as disclosed in Japanese Patent Publication Tokkai 1-204915 and U.S. Pat. No. 4,879,402), (3) those containing unsaturated urethane obtained from polyurethane diisocyanate and tetraol triacrylate (such as disclosed in U.S. Pat. No. 4,608,409), (4) those containing unsaturated urethane obtained from polyurethane tri-~hexa-isocyanate and triol di(meth)acrylate (such as disclosed in U.S. Pat. No. 4,879,402), (5) those containing unsaturated urethane obtained from triisocyanate and diol mono(meth)acrylate or triol di(meth)acrylate (such as disclosed in U.S. Pat. No. 4,868,325), and (6) those containing unsaturated urethane obtained from diisocyanate and triol di(meth)acrylate (such as disclosed in U.S. Pat. No. 4,347,174).

These prior art photocurable resins for stereolithography and compositions containing them, however, do not have good mechanical properties or form precision. Causes for the poor form precision for the stereolithographed object obtained therefrom include the change in the volume of the photocurable resin or its composition while it is hardening, material non-uniformity within the resin or its composition, and the shape of the obtained stereolithographed object itself. These factors contribute together to generate an irregular stress inside the object and, if the force of such stress becomes concentrated in a particular part of the object or a particular direction therein, there may result a deformation such as curvature, torsion and crush, as well as a fracture such as cracks and delamination. The shape of stereolithographed objects having such an internal stress is intrinsically unstable, and such objects are likely to undergo changes in shape with time or sustain a fracture when used under a certain temperature condition or with a load. In general, stereolithographed objects with a low glass transition temperature and a low elastic modulus and hence a high tensile elongation are likely to sustain a deformation, while those with a high glass transition temperature and a low tensile elongation are likely to sustain a fracture.

There have been attempts to improve the properties, and thermal properties in particular, of stereolithographed objects. It has been attempted, for example, to increase the density of ethylenic double bonds within a photocurable resin for stereolithography for increasing the crosslinking density in the stereolithographed object. It has also been attempted, in addition to the above, to have both acrylate and methacrylate groups contained as polymerizable group (as disclosed in Japanese Patent Publication Tokkai 6-199962). By these prior art attempts, however, the volume shrinkage which accompanies photosetting is increased instead, and the form precision of the stereolithographed objects therefrom becomes even worse. By these prior art methods, furthermore, the mechanical properties of stereolithographed objects are adversely affected, and in particular their tensile elongation becomes low. As a result, their toughness factor, defined as the product of the tensile strength and tensile elongation, becomes significantly inferior to the toughness factor of an ordinary thermoplastic resin such as the ABS resin commonly used as the material for plastic molding. Thus, the stereolithographed objects thus obtained can be used only for limited purposes.

SUMMARY OF THE INVENTION

It is therefore an object of this invention to overcome the aforementioned problem of prior art photocurable resins and their compositions for stereolithography, that is, the properties, and in particular the mechanical properties and form precision, of stereolithographed objects obtained therefrom are inferior.

In view of the above and other objects, the present inventors focussed their attention to unsaturated urethane with high double bond density and studied the relationship between the chemical structures of such unsaturated urethane and the vinyl monomers to be used therewith and the form precision, thermal and mechanical properties of the stereolithographed objects obtained therefrom. As a result of such studies, it has been discovered that the objects of the invention can be accomplished if unsaturated urethane with high double bond density having a specified structure and a specified type of vinyl monomer containing N-(meth)acryloylmorpholine are used at specified rates.

DETAILED DESCRIPTION OF THE INVENTION

This invention relates to a photocurable resin for stereolithography comprising unsaturated urethane in the form of

   Formula (1)

and a vinyl monomer which is N-(meth)acryloylmorpholine or a mixture of N-(meth)acryloylmorpholine and di-ol di(meth)-acrylate, the ratio between said unsaturated urethane and said vinyl monomer being 100/25–100/150 by weight, wherein X is a residual group obtained by removing isocyante groups from diisocyanate, $A^1$ and $A^2$ are each a group shown by

   Formula (2)

or

   Formula (3)

where $R^1$, $R^2$ and $R^3$ are each H or $CH_3$; $Y^1$ is a residual group obtained by removing hydroxyl groups from dihydric alcohol; and $Y^2$ is a residual group obtained by removing hydroxyl groups from trihydric alcohol.

Examples of unsaturated urethane shown by Formula (1) include (1) reaction products of mono(meth)acrylate of dihydric alcohol and diisocyanate at molar ratio of 2/1, (2) reaction products of mono(meth)acrylate of dihydric alcohol, di(meth)acrylate of trihydric alcohol and diisocyante at molar ratio of 1/1/1, and (3) reaction product of di(meth)acrylate of trihydric alcohol and diisocyanate at molar ratio of 2/1. Throughout herein "mono(meth)acrylate of dihydric alcohol" shall mean either monoacrylate or monomethacrylate of dihydric alcohol and "di(meth) acrylate of trihydric alcohol" shall mean either diacrylate, dimethacrylate or monoacrylate-monomethacrylate of trihydric alcohol.

Examples of mono(meth)acrylate of dihydric alcohol include mono(meth)acrylates of dihydric alcohol with 2–6 carbon atoms such as 2-hydroxyethyl (meth)-acrylate, hydroxypropyl (meth)acrylate and 1,6-hexanediol mono (meth)acrylate. Examples of di(meth)acrylate of trihydric alcohol include di(meth)acrylates of trihydric alcohol such as glycerol, trimethylolpropane, 5-methyl-1,2,4-heptanetriol and 1,2,6-hexanetriol, but glycerine diacrylate, glycerin dimethacrylate and glycerine monoacrylate monomethacylate are preferably used.

Examples of diisocyantate to be reacted with the mono (meth)acrylate of dihydric or trihydric alcohol described above include (1) aromatic diisocyanates such as all kinds of tolylene diisocyantate and methylene-bis-(4-phenyl isocyanate), (2) aliphatic or alicyclic diisocyanates such as hexamethylene diisocyanate and methylene-bis(4-cyclohexyl isocyanate), and (3) aliphatic alicyclic diisocyanates such as 4-isocyanatomethyl-1-isocyanato-1-methyl-cyclohexane and 5-isocyanatomethyl-1-isocyanato-1,1-dimethyl-5-methyl-cyclohexane (isophorone diisocyanate).

The unsaturated urethane shown by Formula (1) will be asymmetric if it is obtained by using two different kinds of mono(meth)acrylates of dihydric alcohol, two different kinds of di(meth)acrylates of trihydric alcohol or mono (meth)acrylate of dihydric alcohol and di(meth)acrylate of trihydric alcohol. In order to synthesize such asymmetric unsaturated urethane, it is preferable to use the kind of diisocyanate with isocyanate groups having different reaction characteristics such as those having both isocyanate group susceptive to the effects of substituent with steric hindrance characteristic and isocyanate group not susceptive to such effects and those having both isocyanate group connected to aliphatic hydrocarbon group and isocyanate group connected to aromatic hydrocarbon group. Examples of such diisocyanate include 2,4-tolylene diisocyanate, isophorone diisocyanate and 4-isocyanatomethyl-1-isocyanato-1-methyl-cyclohexane.

This invention is not intended to limit the method of synthesizing the unsaturated urethane. A known method such as disclosed in Japanese Patent Publication Tokkai 4-53809 may be used. For the synthesis of asymmetric unsaturated urethane, however, it is preferred to preliminarily obtain unsaturated urethane monoisocyanate by reacting one mole of mono(meth)acrylate of dihydric alcohol or di(meth)acrylate of trihydric alcohol with one mole of diisocyanate of the aforementioned kind with isocyanate groups having different reaction characteristics and then to react it with mono(meth)acrylate of dihydric alcohol or di(meth)acrylate of trihydric alcohol of a different kind.

Of the unsaturated urethanes shown by Formula (1), those having 3 or 4 polymerizable groups in the molecule are preferable according to this invention, and those having both acryloyl and methacryloyl groups as polymerizable groups are even more preferable. In this situation, there is no particular preference as to the ratio between the numbers of acryloyl and methacryloyl groups in the molecule as polymerizable groups, the acryloyl-to-methacyloyl ratio of 2/1 is preferred if there are three polymerizable groups and 2/2–3/1 is preferred if there are four polymerizable groups.

Photocurable resins for stereolithography according to this invention comprise unsaturated urethane shown by Formula (1) and vinyl monomer, the vinyl monomer being either a single system of N-(meth)acryloyl morpholine or a mixed system of N-(meth)acryloyl morpholine and di-ol di(meth)acrylate. Both N-acryloyl morpholine and N-methacryloyl morpholine are usable but N-acryloyl morpholine is preferred.

Examples of di-ol di(meth)acrylate to be mixed with N-(meth)acryloyl morpholine include (1) diacrylates and dimethacrylates of alkane di-ol with 2–6 carbon atoms such as ethylene glycol, propylene glycol, 1,4-butanediol, neopentyl glycol and 1,6-hexanediol, (2) diacrylates and dimethacrylates of di-ol having alicyclic hydrocarbon group with 6–12 carbon atoms such as cyclohexane dimethanol, cyclohexene dimethanol and dicyclopentyp dimethanol, (3) diacrylates and dimethacrylates of (poly)esterdiol such as 1,6-hexanediol hydroxycaprate and neopentylglycol hydroxypivalate obtainable by reacting aliphatic lactone or aliphatic hydroxycarbonic acid with 4–6 carbon atoms with aforementioned alkane di-ol or di-ol, and (4) diacrylates and dimethacylates of alkoxylated bisphenols having alkoxy group with 2–3 carbon atoms such as 2,2-bis(hydroxy-ethoxyphenyl)propane, 2,2-bis(hydroxydiethoxyphenyl) propane, bis(hydroxypropoxyphenyl)methane and bis (hydroxydipropoxyphenyl)methane.

When a mixed system of N-(meth)acryloyl morpholine and diol di(meth)acrylate is used as the vinyl monomer according to this invention, it is preferred that 50 weight % or more of N-(meth)acryloyl morpholine be contained in the vinyl monomer and more preferably 60 weight % or more.

The ratio between the unsaturated urethane and vinyl monomer in the photocurable resins according to this invention for stereolithography is 100/25–100/150 by weight, and more preferably 100/40–100/100.

Photocurable resin compositions for stereolithography according to this invention are characterized as having at least one kind of filler selected from the group consisting of solid particles of average particle diameter 0.1–50 μm and inorganic whiskers with average fiber length 1–70 μm in a photocurable resin of a type described above. If solid particles are used as the filler, those with average particle diameter 3 μm or greater are preferred. If inorganic whiskers are used as the filler, those with fiber diameter 0.3–1 μm and average fiber length 10 μm or greater are preferred. Examples of such filler include (1) inorganic solid particles such as silica, alumina, clay, calcium carbonate and glass beads, (2) organic solid particles such as crosslinked polystyrene, polymethyl methacrylate and polymethyl siloxane, and (3) inorganic whiskers of potassium titanate fibers, magnesium sulfate fibers, magnesium borate fibers, aluminum borate fibers and carbon fibers. When such a filler is contained, the filler preferably comprises 50–400 weight parts per 100 weight parts of a photocurable resin described above. One or more kinds of such filler can be used, but it is preferred to use both inorganic solid particles and inorganic whiskers at rates of 50–300 weight parts of inorganic solid particles and 10–100 weight parts of inorganic whiskers per 100 weight parts of a photocurable resin described above.

When a photocurable resin or its composition according to this invention is used for stereolithography, a photoinitiator is initially caused to be contained therein. The invention does not impose any particular limitation on the kind of photoinitiator to be used, examples of such photoinitiator including (1) carbonyl compounds such as benzoin, α-methyl benzoin, anthraquinone, chloroanthraquinone and acetophenone, (2) sulfur compounds such as diphenyl sulfide, diphenyl disulfide and dithiocarbamate, and (3)

polycyclic aromatic compounds such as α-chloromethyl naphthalene and anthracene. The content of photoinitiator in photocurable resin or its composition for stereolithography is generally 0.1–10 weight parts, and more preferably 1–5 weight parts, to 100 weight parts of the resin or the resin composition. In addition to photoinitiator, use may also be made of a co-initiator such as n-butyl amine, triethanol amine, N,N-dimethyl aminobenzene sulfonic diallylamide and N,N-dimethyl aminoethyl methacrylate.

This invention does not impose any particular limitation on the method of stereolithography by the use of a photocurable resin or its composition. Many methods of stereolithography have been known as disclosed, for example, in Japanese Patent Publications Tokkai 56-144478, 60-247515, 1-204915 and 3-41126 and U.S. Pat. No. 4,842,060. According to one of these methods, a photohardening layer is initially formed with a photocurable resin or its composition and resin or its composition is supplied again on top of the photohardening layer to form another such layer until a desired stereolithographed object is formed. Such a stereolithographed object can be subjected later to a post-cure process. Examples of energy beam which can be used for hardening include visible light rays, ultraviolet rays and electron beams, but the use of ultraviolet rays is preferable.

In what follows, test and comparison examples are used to more clearly describe the contents and effects of this invention, but these examples are not intended to define the scope of the invention. In what follows, "parts" will mean "weight parts", and "%" will mean "weight %" unless otherwise specified.

Part 1 (Preparation of Photocurable Resins for Stereolithography)

Test Examples 1–8 and Comparison Examples 1–5

The method of synthesis described in Japanese Patent Publication Tokkai 4-53809 was used to synthesize unsaturated urethane A-1 (obtained by reacting glycerine monoacrylate monomethacrylate, hydroxyehtyl acrylate and 2,4-tolylene diisocyanate at molar ratio of 1/1/1). Unsaturated urethane A-1 thus synthesized (100 parts) and N-acryloyl morpholine (67 parts) were mixed and dissolved together at room temperature to prepare a photocurable resin for stereolithography (Test Example 1). Photocurable resins according to Test Examples 2–8 and Comparison Examples 1–5 were similarly prepared. Their compositions are shown in Table 1.

TABLE 1

| Examples | Unsaturated Urethane | | Vinyl Monomer | |
|---|---|---|---|---|
| | Type | Parts | Type | Parts |
| Test Examples | | | | |
| 1 | A-1 | 100 | B-1 | 67 |
| 2 | A-2 | 100 | B-1 | 67 |
| 3 | A-3 | 100 | B-1 | 67 |
| 4 | A-1 | 100 | B-1/C-1 | 47/20 |
| 5 | A-2 | 100 | B-1/C-2 | 47/20 |
| 6 | A-3 | 100 | B-1/C-3 | 47/20 |
| 7 | A-2 | 100 | B-2 | 122 |
| 8 | A-3 | 100 | B-2 | 33 |

TABLE 1-continued

| Examples | Unsaturated Urethane | | Vinyl Monomer | |
|---|---|---|---|---|
| | Type | Parts | Type | Parts |
| Comparison Examples | | | | |
| 1 | A-1 | 100 | C-1 | 67 |
| 2 | A-2 | 100 | C-2 | 67 |
| 3 | A-3 | 100 | C-3 | 67 |
| 4 | A-1 | 100 | B-1/C-1 | 200/100 |
| 5 | A-2 | 100 | B-1/C-2 | 7/3 | where:
A-1: Reaction product of glycerine monoacrylate monomethacrylate, hydroxyethyl acrylate and 2,4-tolylene diisocyanate at molar ratio of 1/1/1;
A-2: Reaction product of glycerine diacrylate, hydroxyethyl methacrylate and 2,4-tolylene diisocyanate at molar ratio of 1/1/1;
A-3: Reaction product of hydroxyethyl methacrylate, hydroxyethyl acrylate and isophorone diisocyanate at molar ratio of 1/1/1;
B-1: N-acryloyl morpholine;
B-2: N-methacryloyl morpholine;
C-1: Neopentyl glycol diacrylate;
C-2: Dicyclopentyl dimethylene diacrylate;
C-3: Neopentyl glycol hydroxypivalate diacrylate.

Part 2 (Preparation and Evaluation of Stereolithographed Objects)

(1) Preparation of Stereolithographed Objects

Use was made of an equipment for stereolithography provided with a three-dimensional numerically controlled table having a container set thereto and a helium-cadmium laser beam control system (output=25 mW, wavelength= 3250 A°). The container was filled with a liquid mixture having 3 weight parts of 1-hydroxy cyclo-hexylphenyl ketone dissolved as photoinitiator for photopolymerization in 100 weight parts of photocurable resin for stereolithography prepared in Part 1. The liquid mixture was supplied from this container to a horizontal surface (defined by X-Y axes) in the thickness of 0.10 mm, and a convergent helium-cadmium laser beam was made incident in the perpendicular direction (along the Z-axis) to harden the photocurable resin. Next, the same liquid mixture was supplied on top of this hardened layer in the thickness of 0.10 mm and hardened in a similar manner. This process was repeated until 200 hardened layers were formed in the shape of a cone with the diameter of the bottom surface equal to 200.00 mm and the height of 20.00 mm. The cone-shaped object thus obtained was washed with isopropyl alcohol and then was subjected to a post-cure process by irradiation from a 3 kw ultraviolet lamp for 30 minutes to obtain a stereolithographed object.

(2) Measurement of Mechanical Properties

As described above in (1), objects in the shape of a dumbbell of thickness 3 mm were produced according to JIS (Japanese Industrial Standard) K7113. After the dumbbell-shaped objects were washed with isopropyl alcohol, they were subjected to a post-cure process by heating to 98° C. for 2 hours to obtain test pieces. Three identical test pieces were used to measure their tensile strength (TS), tensile elastic modulus (TEM) and tensile elongation (TE) according to JIS K7113 at tensile rate of 5 mm/second. Toughness factor (Tf) defined as the product of the tensile strength and tensile elongation was calculated for each test piece. The averages of values obtained for three test pieces are shown in Table 2.

(3) Measurement of Thermal Properties

Planar test pieces of dimensions 55 mm×10 mm×2 mm were produced as described above in (2) and their dynamic viscoelasticity was measured to obtain their glass transition temperatures (Tg) indicated by tan δ. The results are also shown in Table 2.

(4) Measurement of Shapes

Two-dimensional figure (FIG. a) was obtained by vertical projection of each of the stereolithographed objects obtained in (1) onto the X-Y plane. Each of these objects was also projected horizontally onto 50 arbitrary planes perpendicular to the X-Y plane to obtain two-dimensional figures (FIGS. b). FIG. a is a circle. Fifty arbitrary straight lines were drawn through the center of gravity of FIG. a and the distance between the two points at which each straight line crosses the figure was measured. The maximum (Max), minimum (Min) and average (Ave) values of these measured distances and their standard deviation (SD) were calculated. FIGS. b are triangles, and their areas were measured. The maximum (Max), minimum (Min) and average (Ave) values of these measured areas and their standard deviation (SD) were calculated. The results are shown in Table 3.

In Tables 2 and 3, Comparison Example 6 is the ABS resin DIAPET HF-5 (produced by Mitsubishi Rayon Company, Ltd.), and test pieces for Comparison Example 6 were obtained by mold injection with cylinder temperature 200° C. and mold temperature 60° C. The shapes and dimensions of the injected test pieces were the same as described in (2) and (3) above.

TABLE 2

| Examples | Mechanical Properties | | | | Thermal Properties Tg (°C.) |
|---|---|---|---|---|---|
| | Tensile Strength (kgf/mm$^2$) | Tensile Elastic Modulus (kgf/mm$^2$) | Tensile Elongation (%) | TO (Kgf/mm$^2$) | |
| Test Example | | | | | |
| 1 | 12.9 | 410 | 5.6 | 72 | 198 |
| 2 | 13.0 | 422 | 5.0 | 65 | 197 |
| 3 | 10.8 | 368 | 6.7 | 72 | 154 |
| 4 | 12.9 | 404 | 4.9 | 63 | 192 |
| 5 | 12.4 | 387 | 4.7 | 58 | 193 |
| 6 | 10.2 | 315 | 6.2 | 63 | 137 |
| 7 | 13.5 | 433 | 4.4 | 59 | 211 |
| 8 | 11.6 | 370 | 5.0 | 58 | 165 |
| Comparison Example | | | | | |
| 1 | 9.5 | 348 | 1.7 | 16 | 134 |
| 2 | 9.4 | 316 | 1.8 | 17 | 130 |
| 3 | 8.0 | 238 | 2.9 | 23 | 123 |
| 4 | 8.4 | 259 | 2.2 | 18 | 139 |
| 5 | 14.0 | 430 | 1.1 | 15 | 206 |
| 6 | 4.1 | 250 | 11.5 | 47 | 110 |

TABLE 3

| | Shape | | | | | | | |
|---|---|---|---|---|---|---|---|---|
| | FIG. a | | | | FIG. b | | | |
| Examples | Ave (mm) | Max (mm) | Min (mm) | SD (mm) | Ave (mm$^2$) | Max (mm$^2$) | Min (mm$^2$) | SD (mm$^2$) |
| Test Examples | | | | | | | | |
| 1 | 199.04 | 199.24 | 198.83 | 0.10 | 1984 | 1988 | 1980 | 1.9 |
| 2 | 199.03 | 199.25 | 198.82 | 0.11 | 1983 | 1987 | 1979 | 1.9 |
| 3 | 199.17 | 199.34 | 198.99 | 0.09 | 1987 | 1991 | 1982 | 2.0 |
| 4 | 198.88 | 199.25 | 198.50 | 0.18 | 1982 | 1989 | 1974 | 3.1 |
| 5 | 198.84 | 199.18 | 198.56 | 0.16 | 1981 | 1987 | 1974 | 3.0 |
| 6 | 199.12 | 199.40 | 198.84 | 0.14 | 1985 | 1992 | 1978 | 3.3 |
| 7 | 198.61 | 199.07 | 198.15 | 0.21 | 1979 | 1989 | 1970 | 4.7 |
| 8 | 199.22 | 199.60 | 198.81 | 0.20 | 1987 | 1996 | 1979 | 4.1 |
| Comparison Example | | | | | | | | |
| 1 | 197.87 | 198.82 | 196.80 | 0.50 | 1970 | 1995 | 1949 | 11.4 |
| 2 | 197.19 | 199.01 | 197.10 | 0.45 | 1973 | 1994 | 1950 | 10.2 |
| 3 | 198.51 | 199.37 | 197.64 | 0.34 | 1977 | 1996 | 1957 | 9.6 |
| 4 | 198.37 | 199.18 | 197.53 | 0.41 | 1976 | 1987 | 1954 | 10.3 |
| 5 | 198.24 | 199.98 | 197.47 | 0.35 | 1974 | 1992 | 1957 | 8.1 |
| 6 | — | — | — | — | — | — | — | — |

Part 3 (Preparation of Photocurable Resin Compositions for Stereolithography)

Test Examples 9–12 and Comparison Examples 7 and 8

Photocurable resin according to Test Example 1 in Part 1 for stereolithography (100 weight parts), photoinitiator (3 weight parts), inorganic solid particles (200 weight parts) and inorganic whiskers (50 weight parts) were placed inside a mixing container equipped with a two-shaft stirring device, and the mixture was stirred until it became uniform. The stirred mixture was filtered through a 50 μm-filter to prepare Test Example 9 of photocurable resin composition. Test Examples 10–12 and Comparison Examples 7 and 8 were similarly prepared. Their compositions are shown in Table 4.

TABLE 4

|  | Photocurable Resin | | Inorganic Whiskers | | Inorganic Solid Particles | | Photoinitiator | |
|---|---|---|---|---|---|---|---|---|
|  | Kind | Amount (Part) | Kind | Amount (Part) | Kind | Amount (Part) | Kind | Amount (Part) |
| Test Example | | | | | | | | |
| 9 | Test Ex. 1 | 100 | D-1 | 50 | E-1 | 200 | F-1 | 3 |
| 10 | Test Ex. 3 | 100 | D-1 | 50 | E-1 | 200 | F-1 | 3 |
| 11 | Test Ex. 5 | 100 | D-1 | 50 | E-1 | 200 | F-1 | 3 |
| 12 | Test Ex. 7 | 100 | D-1 | 40 | E-2 | 150 | F-1 | 3 |
| Comparison Example | | | | | | | | |
| 7 | Comp. Ex. 1 | 100 | D-1 | 50 | E-1 | 200 | F-1 | 3 |
| 8 | Comp. Ex. 3 | 100 | D-1 | 50 | E-1 | 200 | F-1 | 3 | where:
D-1: Aluminum borate whiskers with average diameter 0.8 μm and average fiber length 20 μm (ALBOREX YS-4 produced by Shikoku Chemical Corporation);
E-1: Glass beads with average particle diameter 30 μm (GB-730C produced by Toshiba Ballotini);
E-2: Aluminum hydroxide with average particle diameter 8 μm (B-103 produced by Nippon Light Metal Company Ltd.);
F-1: 1-hydroxy cyclohexyl phenylketone.

Part 4 (Preparation and Evaluation of Stereolithographed Objects)

(1) Preparation of Stereolithographed Objects

Use was made of the photocurable resin compositions for stereolithography prepared in Part 3 to form cone-shaped objects as done in Part 2. The objects thus obtained were washed with isopropyl alcohol and then subjected to a post-cure process by heating to 98° C. for 2 hours.

(2) Measurement of Physical and Thermal Properties and Shape

Mechanical and thermal properties and shape were measured on test pieces prepared separately as done in Part 2 as well as on the objects prepared in (1) above. The results are shown in Tables 5 and 6.

In Comparison Examples 7 and 8, cracks were observed on the surface of the test objects.

From the description presented above, it can be understood clearly that the present invention can provide stereolithographed objects with superior mechanical and thermal properties and form precision.

TABLE 5

| | Mechanical Properties | | | | Thermal Properties |
|---|---|---|---|---|---|
| Examples | Tensile Strength ($kgf/mm^2$) | Tensile Elastic Modulus ($kgf/mm^2$) | Tensile Elongation (%) | To ($Kgf/mm^2$) | Tg (°C.) |
| Test Example | | | | | |
| 9 | 11.4 | 1360 | 1.6 | 18 | 203 |
| 10 | 9.6 | 1210 | 2.0 | 19 | 157 |
| 11 | 11.0 | 1290 | 1.6 | 18 | 195 |
| 12 | 11.8 | 1330 | 1.5 | 18 | 214 |
| Comparison Example | | | | | |
| 7 | 8.6 | 1290 | 0.9 | 7.7 | 139 |
| 8 | 7.4 | 1010 | 1.1 | 8.1 | 127 |

TABLE 6

| | Shape | | | | | | | |
|---|---|---|---|---|---|---|---|---|
| | FIG. a | | | | FIG. b | | | |
| Examples | Ave (mm) | Max (mm) | Min (mm) | SD (mm) | Ave ($mm^2$) | Max ($mm^2$) | Min ($mm^2$) | SD ($mm^2$) |
| Test Examples | | | | | | | | |
| 9 | 199.54 | 199.63 | 199.45 | 0.04 | 1993 | 1996 | 1991 | 1.0 |

TABLE 6-continued

| | Shape | | | | | | | |
|---|---|---|---|---|---|---|---|---|
| | FIG. a | | | | FIG. b | | | |
| Examples | Ave (mm) | Max (mm) | Min (mm) | SD (mm) | Ave (mm²) | Max (mm²) | Min (mm²) | SD (mm²) |
| 10 | 199.63 | 199.82 | 199.55 | 0.04 | 1994 | 1997 | 1990 | 1.2 |
| 11 | 199.50 | 199.67 | 199.42 | 0.08 | 1993 | 1996 | 1989 | 1.7 |
| 12 | 199.51 | 199.73 | 199.30 | 0.10 | 1993 | 1998 | 1988 | 2.1 |
| Comparison Example | | | | | | | | |
| 7 | 199.19 | 199.75 | 198.56 | 0.27 | 1987 | 1996 | 1977 | 4.5 |
| 8 | 199.30 | 199.82 | 198.77 | 0.24 | 1988 | 1997 | 1979 | 4.2 |

What is claimed is:

1. A photocurable resin for stereolithography comprising unsaturated urethane in the form of $A^1XA^2$ and a vinyl monomer which is N-(meth)acryloyl morpholine or a mixture of N-(meth)acryloyl morpholine and di-ol di(meth) acrylate, the ratio between said unsaturated urethane and said vinyl monomer being 100/25–100/150 by weight, wherein X is a residual group obtained by removing isocyanate groups from diisocyanate, $A^1$ and $A^2$ are each a group shown by

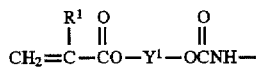

or

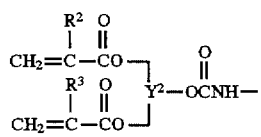

where $R^1$, $R^2$ and $R^3$ are each H or $CH_3$; $Y^1$ is a residual group obtained by removing hydroxyl groups from dihydric alcohol; and $Y^2$ is a residual group obtained by removing hydroxyl groups from trihydric alcohol.

2. The photocurable resin for stereolithography of claim 1 wherein said unsaturated urethane in the form of $A^1XA^2$ contains both acryloyl group and methacyloyl group in the molecule thereof.

3. The photocurable resin for stereolithography of claim 1 wherein said vinyl monomer contains N-(meth)acryloyl morpholine by 50 weight % or more and di-ol di(meth) acrylate by 50 weight % or less.

4. The photocurable resin for stereolithography of claim 2 wherein said vinyl monomer contains N-(meth)acryloyl morpholine by 50 weight % or more and di-ol di(meth) acrylate by 50 weight % or less.

5. The photocurable resin for stereolithography of claim 3 wherein said di-ol di(meth)acrylate is at least one kind selected from the di(meth)acrylate group consisting of di(meth)acrylates of alkane di-ols having 2–6 carbon atoms, di(meth)acrylates of di-ols having alicyclic hydrocarbon group with 6–12 carbon atoms, di(meth)acrylates of ester di-ols obtained by reacting alkane di-ol with 2–6 carbon atoms with monohydroxy carboxylic acid with 4–6 carbon atoms, and di(meth)acrylates of alkoxylated bisphenols having alkoxy group with 2–3 carbon atoms.

6. The photocurable resin for stereolithography of claim 4 wherein said di-ol di(meth)acrylate is at least one kind selected from the di(meth)acrylate group consisting of di(meth)acrylates of alkane di-ols having 2–6 carbon atoms, di(meth)acrylates of di-ols having alicyclic hydrocarbon group with 6–12 carbon atoms, di(meth)acrylates of ester di-ols obtained by reacting alkane di-ol with 2–6 carbon atoms with monohydroxy carboxylic acid with 4–6 carbon atoms, and di(meth)acrylates of alkoxylated bisphenols having alkoxy group with 2–3 carbon atoms.

7. A photocurable resin composition for stereolithography comprising the photocurable resin of claim 1 for stereolithography and 50–400 weight parts of at least one kind of filler selected from the group consisting of solid particles with average particle diameter 0.1–50 μm and inorganic whiskers with average fiber length 1–70 μm for 100 weight parts of said photocurable resin.

8. A photocurable resin composition for stereolithography comprising the photocurable resin of claim 5 for stereolithography and 50–400 weight parts of at least one kind of filler selected from the group consisting of solid particles with average particle diameter 0.1–50 μm and inorganic whiskers with average fiber length 1–70 μm for 100 weight parts of said photocurable resin.

9. A photocurable resin composition for stereolithography comprising the photocurable resin of claim 6 for stereolithography and 50–400 weight parts of at least one kind of filler selected from the group consisting of solid particles with average particle diameter 0.1–50 μm and inorganic whiskers with average fiber length 1–70 μm for 100 weight parts of said photocurable resin.

10. The photocurable resin composition of claim 7 for stereolithography wherein said filler consists of 10–100 weight parts of said inorganic whiskers and 50–300 weight parts of inorganic solid particles.

11. The photocurable resin composition of claim 8 for stereolithography wherein said filler consists of 10–100 weight parts of said inorganic whiskers and 50–300 weight parts of inorganic solid particles.

12. The photocurable resin composition of claim 9 for stereolithography wherein said filler consists of 10–100 weight parts of said inorganic whiskers and 50–300 weight parts of inorganic solid particles.

* * * * *

UNITED STATES PATENT AND TRADEMARK OFFICE
CERTIFICATE OF CORRECTION

PATENT NO. : 5,731,388
DATED : March 24, 1998
INVENTOR(S) : Toshiharu Suzuki et al.

It is certified that error appears in the above-identified patent and that said Letters Patent is hereby corrected as shown below:

On the Title Page [*] replace:
"[*] Notice:   The term of this patent shall not extend beyond the expiration date of Pat. No. 5,591,388"

with

--[*] Notice:   The term of this patent shall not extend beyond the expiration date of Pat. No. 5,591,563--

Signed and Sealed this

Ninth Day of June, 1998

Attest:

BRUCE LEHMAN

Attesting Officer    Commissioner of Patents and Trademarks